US009052145B2

(12) United States Patent
Jung et al.

(10) Patent No.: US 9,052,145 B2
(45) Date of Patent: Jun. 9, 2015

(54) SUBSTRATE FIRING DEVICE

(75) Inventors: Won-Woong Jung, Suwon-si (KR); Hyun-Cheul Shin, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1038 days.

(21) Appl. No.: 12/458,184

(22) Filed: Jul. 2, 2009

(65) Prior Publication Data

US 2010/0003629 A1 Jan. 7, 2010

(30) Foreign Application Priority Data

Jul. 2, 2008 (KR) ........................ 10-2008-0063872

(51) Int. Cl.

| | |
|---|---|
| ***H01L 21/324*** | (2006.01) |
| ***F27B 17/00*** | (2006.01) |
| ***F27B 5/04*** | (2006.01) |
| ***F27B 5/14*** | (2006.01) |
| ***F27D 5/00*** | (2006.01) |

(52) U.S. Cl.

CPC ............... *F27B 17/0016* (2013.01); *F27B 5/04* (2013.01); *F27B 5/14* (2013.01); *F27D 5/00* (2013.01)

(58) Field of Classification Search

CPC ..................................................... F27D 5/0025
USPC ......................... 432/231; 211/41.18; 206/711
See application file for complete search history.

(56) References Cited

U.S. PATENT DOCUMENTS 5,393,226 A * 2/1995 Groom .......................... 432/258
5,674,786 A * 10/1997 Turner et al. .................. 438/758
6,186,344 B1 * 2/2001 Park et al. .................... 211/41.1
6,691,876 B2 * 2/2004 Tsai et al. .................. 211/41.18
7,559,730 B2 * 7/2009 Song ............................ 414/217
7,618,256 B2 * 11/2009 Park et al. ..................... 432/258
8,127,692 B2 * 3/2012 Choi ............................... 108/59
2003/0173316 A1 * 9/2003 Park et al. .................. 211/41.18
2004/0069680 A1 * 4/2004 Song ............................ 206/711

(Continued)

FOREIGN PATENT DOCUMENTS

JP 2001151524 A 6/2001
JP 2001328870 A 11/2001

(Continued)

OTHER PUBLICATIONS

Japanese Office Action issued on May 8, 2012 by JPO in connection with Japanese Patent Application Serial No. 2009-004032, which also claims Korean Patent Application Serial No. 10-2008-0063872 as its priority document and Request for Entry of the Accompanying Office Action attached herewith.

(Continued)

*Primary Examiner* — Gregory Huson
*Assistant Examiner* — John Bargero
(74) *Attorney, Agent, or Firm* — Robert E. Bushnell, Esq.

(57) ABSTRACT

A substrate firing device having an increased contact area between the substrate and substrate support portions, thereby preventing the substrate support portions from generating scratches on the substrate when the substrate expands and contracts due to heating and cooling. By increasing the contact area to the substrate and by using quartz on items that contact the substrate, it is possible to prevent scratches occurring on a substrate, even after an etching process of the substrate, thereby improving quality of the slimmer final product.

21 Claims, 5 Drawing Sheets

(56) References Cited

U.S. PATENT DOCUMENTS

| | | | | |
|---|---|---|---|---|
| 2004/0069728 | A1* | 4/2004 | Huang et al. | 211/41.18 |
| 2006/0011507 | A1* | 1/2006 | Uchida et al. | 206/711 |
| 2006/0016770 | A1* | 1/2006 | Liu | 211/41.18 |
| 2008/0145533 | A1* | 6/2008 | Honda et al. | 427/248.1 |

FOREIGN PATENT DOCUMENTS

| | | | |
|---|---|---|---|
| JP | 2007049112 | A | 2/2007 |
| JP | 2007-084111 | | 4/2007 |
| JP | 2007230801 | A | 9/2007 |
| JP | 2008085206 | A | 4/2008 |
| KR | 10-2002-0059072 | | 7/2002 |
| KR | 10-2005-0049212 | | 5/2005 |
| KR | 1020050090917 | A | 9/2005 |
| KR | 10-20060-021502 | | 3/2006 |

OTHER PUBLICATIONS

Korean Office Action issued by Korean Patent Office on Apr. 28, 2014 in connection with KR 10-2008-0063872 which is the priority document to the present application and Request for Entry of the Accompanying Office Action attached herewith.

Korean Notice of Allowance dated Dec. 22, 2014 of the Korean Patent Application No. 10-2008-0063872. English translation.

* cited by examiner

SUBSTRATE FIRING DEVICE

CLAIM OF PRIORITY

This application makes reference to, incorporates the same herein, and claims all benefits accruing under 35 U.S.C. §119 from an application earlier filed in the Korean Intellectual Property Office on 2 Jul. 2008 and there duly assigned Serial No. 10-2008-0063872.

BACKGROUND OF THE INVENTION

1. Field of the Invention

The present invention relates to substrate firing device that prevents the substrate support portions from generating scratches on the substrate upon contraction or expansion of the substrates caused by rising and falling temperature of the substrate firing device by increasing a contact area between the substrate and substrate support portions.

2. Description of the Related Art

In general, in manufacturing a flat panel display device such as a plasma display device, a liquid crystal display device or an organic light emitting display device, a printing process, a drying process, a firing process and the like are performed to form an electrode layer, a dielectric layer, barrier ribs and the like, depending on materials constituting them, production methods, and the like. Among these processes, the firing process is a process of curing a curable material by heating a combined raw material. In a substrate firing device performing such a firing process, a plurality of substrates are loaded in a thickness direction of the substrates, and support portions supporting the respective substrates are formed. The support portions are arranged beneath a bottom surface of each of the substrates to support the substrate in a point contact form at both ends of the substrate in a direction that the substrate is loaded into and unloaded from the substrate firing device.

In this arrangement, since the substrate and the support portion form a point contact with each other, a concentrated load is applied to this tiny contacted portion. This can cause the substrate support portions to generate scratches on the substrate upon contraction or expansion of the substrates that occurs when the temperature in the substrate firing device rises and falls.

As flat panel display devices become slimmer, if scratches are generated on a substrate in a substrate firing process, the scratches generated on the substrate remains even after an etching of the substrate. Therefore, the quality of a final product can be degraded.

SUMMARY OF THE INVENTION

Accordingly, it is an object of the present invention to provide a substrate firing device which increases the contact area between the substrate and substrate support portions, thereby preventing the substrate support portions from generating scratches on the substrate when the substrate expands and contracts due to the rise and fall of temperature of the substrate firing device.

According to an aspect of the present invention, the present invention provides a substrate firing device, which includes a firing furnace, a heating portion to heat a substrate to a firing temperature by supplying heat into the firing furnace, a plurality of first support portions that includes quartz material and spaced apart from one-another by a distance in an up and down direction, each of the plurality of first support portions to load the substrate by including a support frame horizontally arranged on an inner surface of the firing furnace, and at least one support pin protruding from one region of the support frame to a central portion of the firing furnace and a second support portion that includes quartz material and is arranged to be in contact with an edge region of a bottom surface of the substrate by being arranged on the support pins of ones of the plurality of first support portions.

The support frames can be arranged to be opposite to each other on opposing inner surfaces of the firing furnace and perpendicular to a direction in which the substrate is loaded and unloaded. The second support portion can have a flat plate shape. The support frames can be arranged on inner surfaces of the firing furnace except for one region of a surface through which the substrate is loaded and unloaded. The second support portion can have a shape selected from a group consisting of a flat plate shape and a rod shape. The heating portion can be arranged on an outer surface of the firing furnace. The heating portion can include an electric heater and a heat sink, the electric heater being arranged on the heat sink, the heat sink to spread heat produced by the electric heater. The substrate firing device can also include a gate portion arranged so that the substrate is loaded and unloaded through a front surface of the firing furnace. The gate portion can include an entire position control portion and at least one position control portion.

According to another aspect of the present invention, there is provided a substrate firing device that includes a firing furnace, a heating portion arranged on an outside surface of the firing furnace, a plurality of first support portions that includes quartz material arranged on at least two inner surfaces of the firing furnace and stacked on top of one-another in an up and down direction, each of the plurality of first support portions include a support frame horizontally arranged on an inner surface of the firing furnace and at least one support pin protruding from a region of the support frame to a central portion of the firing furnace and a second support portion arranged on the support pins of the first support portions, the second support portion including a quartz material and arranged to be in contact with an edge region of a bottom surface of the substrate, the second support portion having flat plate shape. The second support portion can have a U-shape and being arranged on left, right and back inner walls of the firing furnace. The second support portion can be arranged on left right, back and a portion of a front inner wall of the firing furnace.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Figure 1:
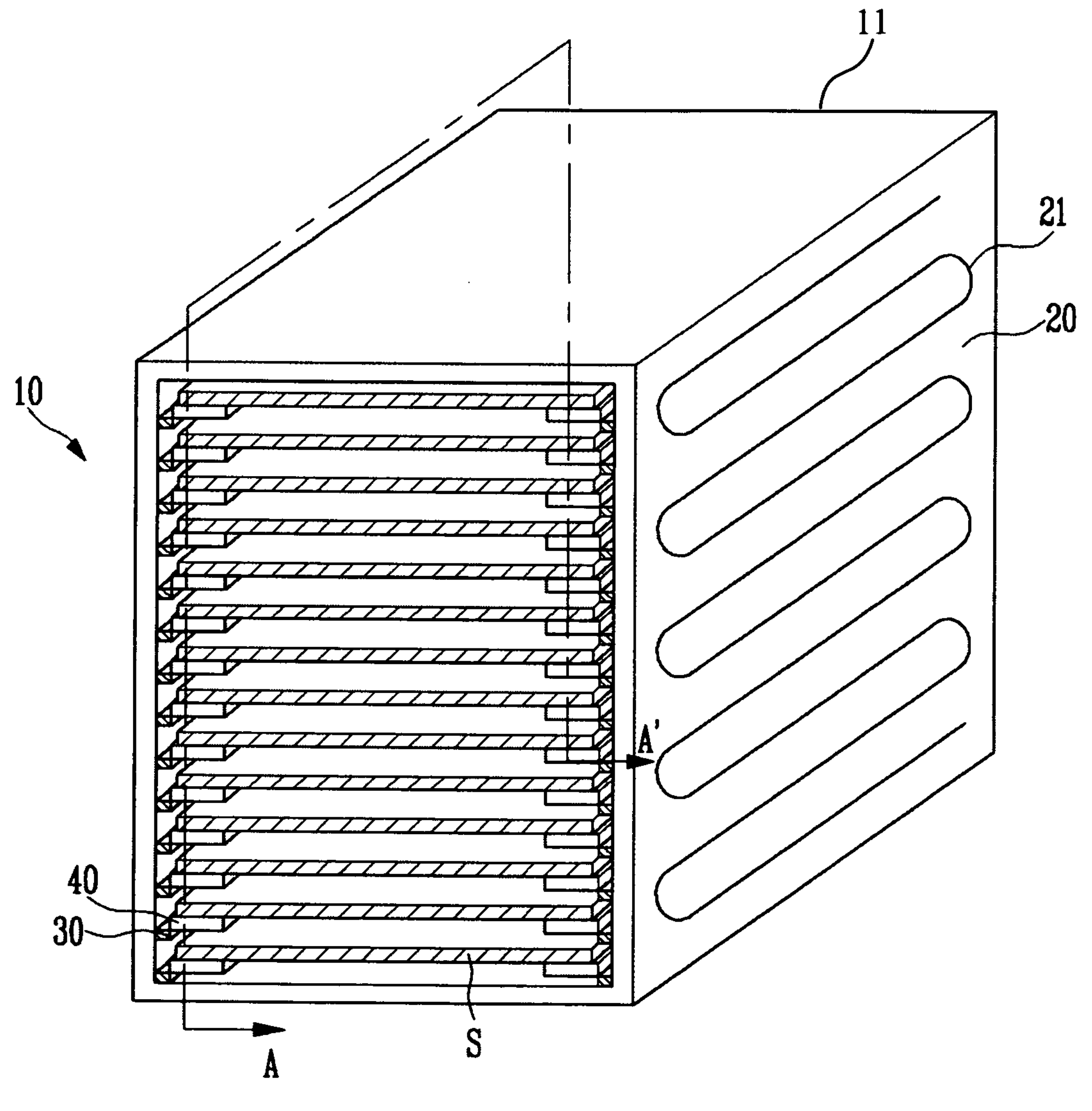
FIG. 1 is a perspective view schematically showing a substrate firing device according to the present invention.

In the following detailed description, only certain exemplary embodiments of the present invention have been shown and described, simply by way of illustration. As those skilled in the art would realize, the described embodiments can be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Turning now to FIG. 1, FIG. 1 is a perspective view schematically showing a substrate firing device 10 according to the present invention. Referring to FIG. 1, the substrate firing device 10 according to the present invention includes a heating portion 21, a first support portion 30 and a second support portion 40. The heating portion 21 is arranged at an outside of the substrate firing device 10. The first support portion 30, including a support frame and support pins, is arranged within the substrate firing device 10. Support frames 30*a* (see FIG. 2A) are horizontally arranged on inner surfaces of the substrate firing device 10 so that when a substrate S is loaded onto the support frames 30*a*, and at least one support pin 30*b* (see FIG. 2A) protrudes from one region of the support frame 30*a* to a central portion of the substrate firing device 10. Preferably, as many support pins 30*b* as possible are arranged as they can horizontally support the substrate S. The second support portion 40 is arranged on the support pins 30*b* of the first support portion 30 and arranged to be in contact with an edge of a bottom surface of the substrate S at a predetermined region.

Here, the heating portion 21 supplies heat to an inside of a firing furnace so that the substrate S is heated to a firing temperature. The heating portions 21 are arranged on both side surfaces and on top and bottom surfaces of an outside of the substrate firing device 10. The heating portion 21 can be arranged as an electric heater, and the electric heater can be arranged in a heat sink 20 so that all portions of the substrate S can be uniformly heated. Although it has been described in the embodiment of the present invention that the heating portion 21 is an electric heater, the present invention is not limited thereto. That is, any heater capable of heating a substrate to a uniform temperature can be used as the heating portion 21.

In the present invention, the first and second support portions 30 and 40 are made out of quartz. This is because the inside of a high-temperature firing device climbs to a temperature of over 500° C., and temperature uniformity should be maintained within ±5° C. The first support portions 30, each including a support frame 30*a* and support pins 30*b*, are arranged in an up and down direction and are spaced apart from each other by a predetermined distance. Preferably, this predetermined distance is as small as possible.

The substrate firing device 10 according to the present invention further includes a gate portion 50 (see FIG. 3) arranged so that the substrate S can be loaded into and unloaded from a front surface of the substrate firing device 10. Here, the gate portion 50 is provided with an entire position control portion 51 and at least one segmented position control portion 50*a* to 50*c*. The respective position control portions can be moved up and down and be driven so that a substrate S is easily loaded into and unloaded from a desired position in the substrate firing device 10. A detailed operation of such a gate portion will be described later in FIG. 3.

Figure 2A:
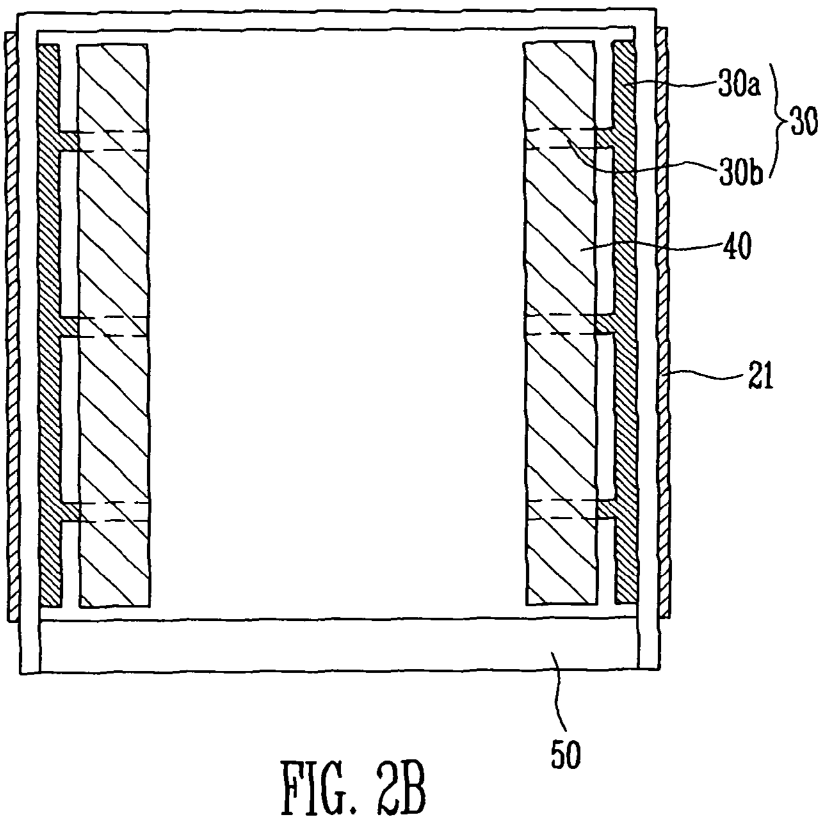
FIG. 2A is a plan view of a substrate firing device according to a first embodiment of the present invention.
Figure 2B:
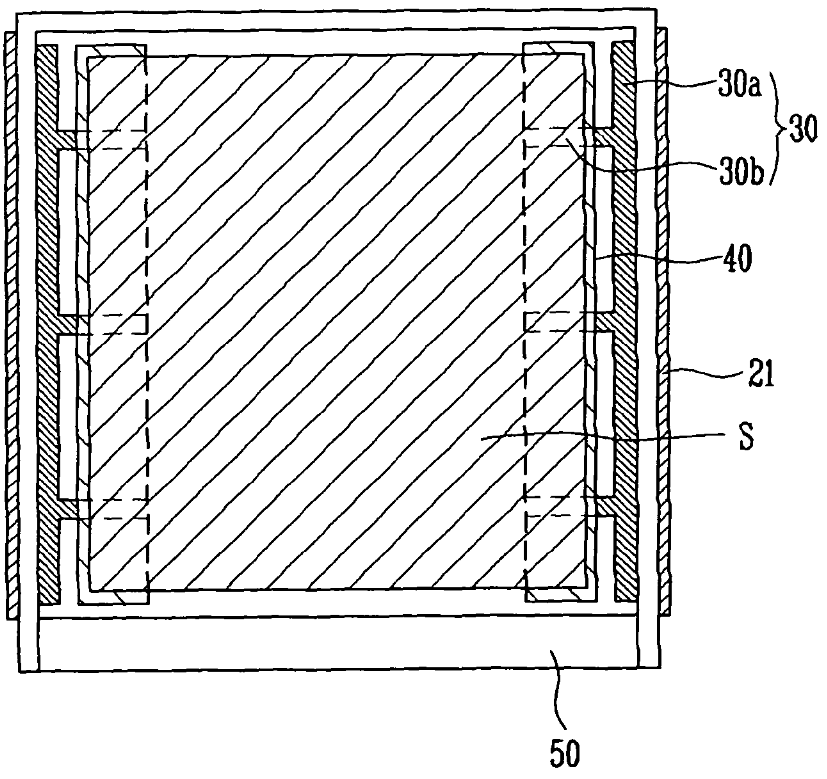
FIG. 2B is a plan view of the substrate firing device of FIG. 2A in which a substrate is arranged.

Turning to FIGS. 2A and 2B, FIG. 2A is a plan view of a substrate firing device according to a first embodiment of the present invention, and FIG. 2B is a plan view of the substrate firing device of FIG. 2A with a substrate S loaded within. Referring to FIGS. 2A and 2B, in the substrate firing device according to the first embodiment of the present invention, first support portions 30 are arranged on both inner surfaces perpendicular to a direction in which a substrate S is loaded and unloaded. The first support portions 30 are arranged on left and right inner surfaces that are opposite to each other in the substrate firing device.

Each of the first support portion 30 includes a support frame 30*a* and support pins 30*b*. The support frames 30*a* are securely arranged on the inner surface of the substrate firing device so that the support pins 30*b* connected to the support frames 30*a* support the substrate S. The support frames 30*a* are horizontally arranged on both inner surfaces of the substrate firing device to support the substrate S.

Each of the support pins 30*b* protrude from one region of a support frame 30*a* to a central portion of the substrate firing device, so that the support pins 30*b* support bottom surfaces at both sides of the substrate S. In this embodiment, three support pins 30*b* are arranged on each support frame 30*a* to support three portions of the substrate S, however the number of support pins 30*b* can vary depending on the size of the substrate S.

Second support portions 40 have a flat plate shape and are arranged on the support pins 30*b* of the first support portions 30. As shown in FIG. 2B, the flat plate-shaped second support portions 40 are in contact with the bottom surfaces of the substrate S at both sides of the substrate to support the substrate S. Accordingly, it is possible to prevent the second support portions 40 from generating scratches on the substrate S when the substrate expands and contracts due to the temperature changes in the substrate firing device. Since scratches are not generated on the substrate in a firing process, it is possible to prevent scratches from being generated on the substrate S, even after an etching process of the substrate, thereby improving the quality of the slimmer final product.

In this embodiment, heating portions 21 are arranged on outer surfaces and at both sides of the substrate firing device. However, it will be apparent that the heating portions 21 can instead be arranged on a surface opposite to the gate portion 50.

Figure 3:
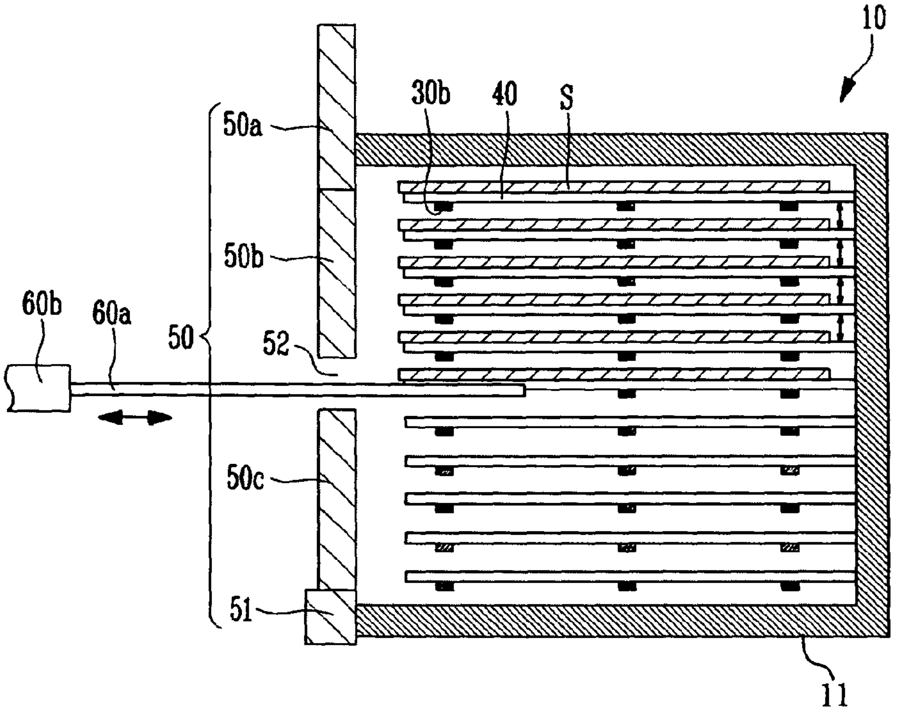
FIG. 3 is a cross-sectional view taken along line A-A' of FIG. 1.

Turning now to FIG. 3, FIG. 3 is a cross-sectional view taken along line A-A' of FIG. 1. Referring to FIG. 3, the gate portion 50 of the present invention is arranged on a front surface of the firing furnace 11 so that the substrate S can be loaded and unloaded. In the embodiment of the present invention, the gate portion 50 includes an entire position control portion 51, a first segmented position control portion 50*a*, a second segmented position control portion 50*b* and a third segmented position control portion 50*c*.

Each of the entire position control portion 51 and the first, second and third segmented position control portions 50*a*, 50*b* and 50*c* has an up-and-down moving portion so that the substrate S can be loaded and unloaded at a desired position of the gate portion 50. That is, by controlling the entire position control portion 51 and the first, second and third segmented position control portions 50*a*, 50*b* and 50*c* to individually move up and down, an opening 52 can be arranged at the same height as that of a second support portion 40 into or from which the substrate S will be loaded to and unloaded from among the second support portions 40 arranged in multiple steps within the firing furnace. The substrate S can be loaded and unloaded through the opening 52 arranged as described above. Accordingly, the substrate S can be placed at a desired position while traveling a transfer arm 60*a* coupled to a base arm 60*b*.

Figure 4:
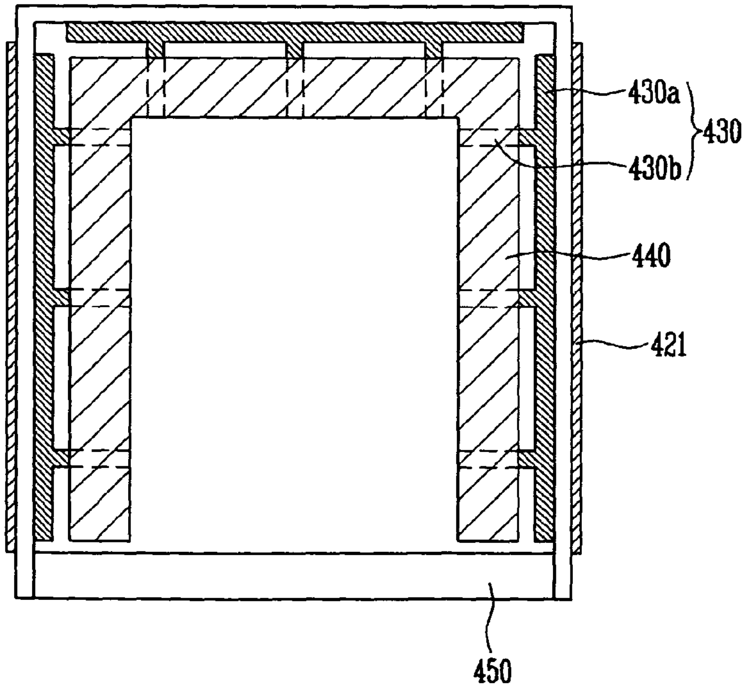
FIG. 4 is a plan view of a substrate firing device according to a second embodiment of the present invention.
Figure 5:
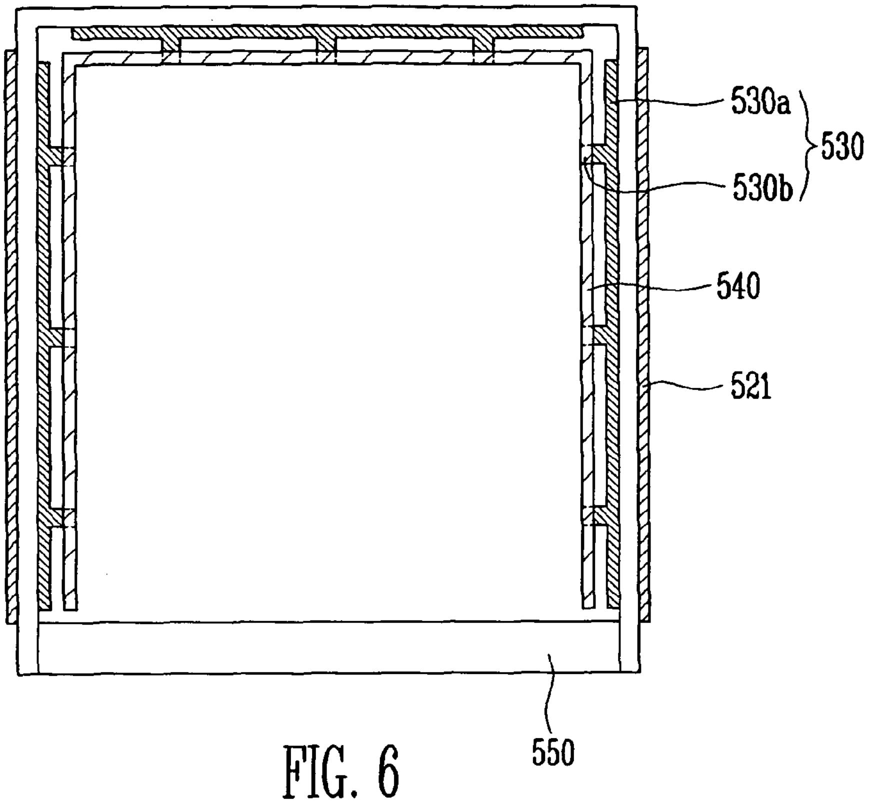
FIG. 5 is a plan view of a substrate firing device according to a third embodiment of the present invention.

Turning now to FIGS. 4 and 5, FIG. 4 is a plan view of a substrate firing device according to a second embodiment of the present invention, and FIG. 5 is a plan view of a substrate firing device according to a third embodiment of the present invention. In the following descriptions of FIGS. 4 and 5, description of the same elements as that of the first embodiment of the present invention will be omitted.

Referring to FIG. 4, in the substrate firing device according to the second embodiment of the present invention, first support portions 430 are arranged on left, right and back inner surfaces of the firing furnace but not on a surface through which a substrate S is loaded and unloaded. Each of the first support portions 430 includes a support frame 430*a* and support pins 430*b*, and the support frame 430*a* is fixedly arranged on an inner surface of the substrate firing device. Each of the support pins 430*b* protrudes from one region of the support frame 430*a* to a central portion of the substrate firing device to support an edge of a bottom surface of the substrate S. A second support portion 440 is arranged on the support pins 430*b* of the first support portion 430. At this time, the second support portion 440 has a flat plate shape and supports the substrate S while being in contact with the edge of the bottom surface of the substrate S at a predetermined region. Here, the first and second support portions 430 and 440 are made out of a quartz material that is less influenced by temperature variations within the firing furnace, so that it is possible to prevent the support portions 430 and 440 from generating scratches on the substrate during the firing process.

As shown in FIG. 5, a second support portion 540 is arranged on support pins 530*b* of a first support portion 530 according to the third embodiment of the present invention. At this time, the second support portion 540 has a rod shape and supports a substrate while being line-contacted with an edge of a bottom surface of the substrate.

Figure 6:
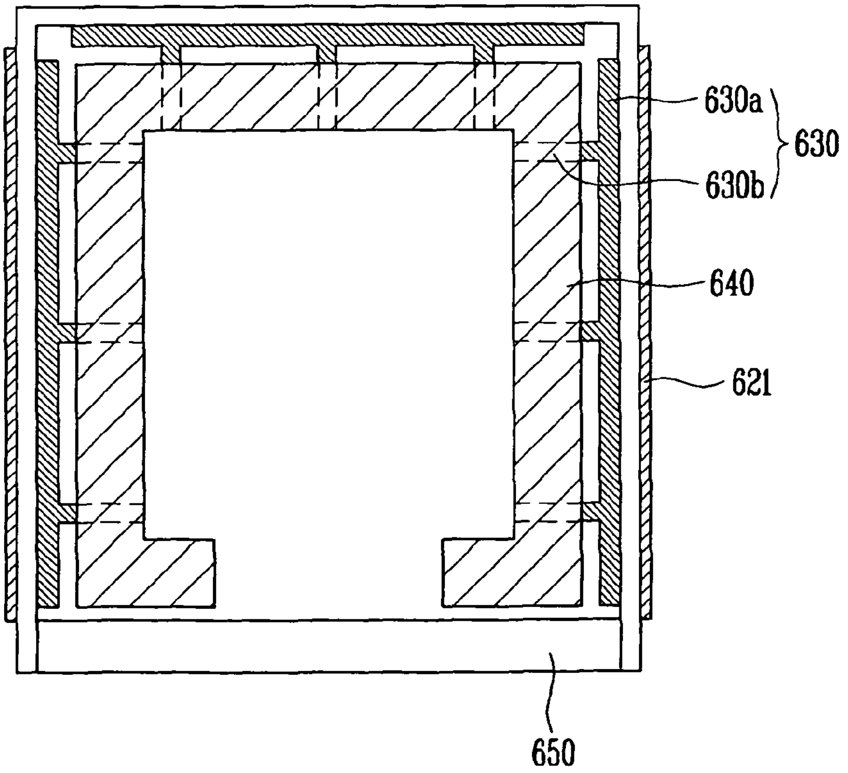
FIG. 6 is a plan view of a substrate firing device according to a fourth embodiment of the present invention.
Figure 7:
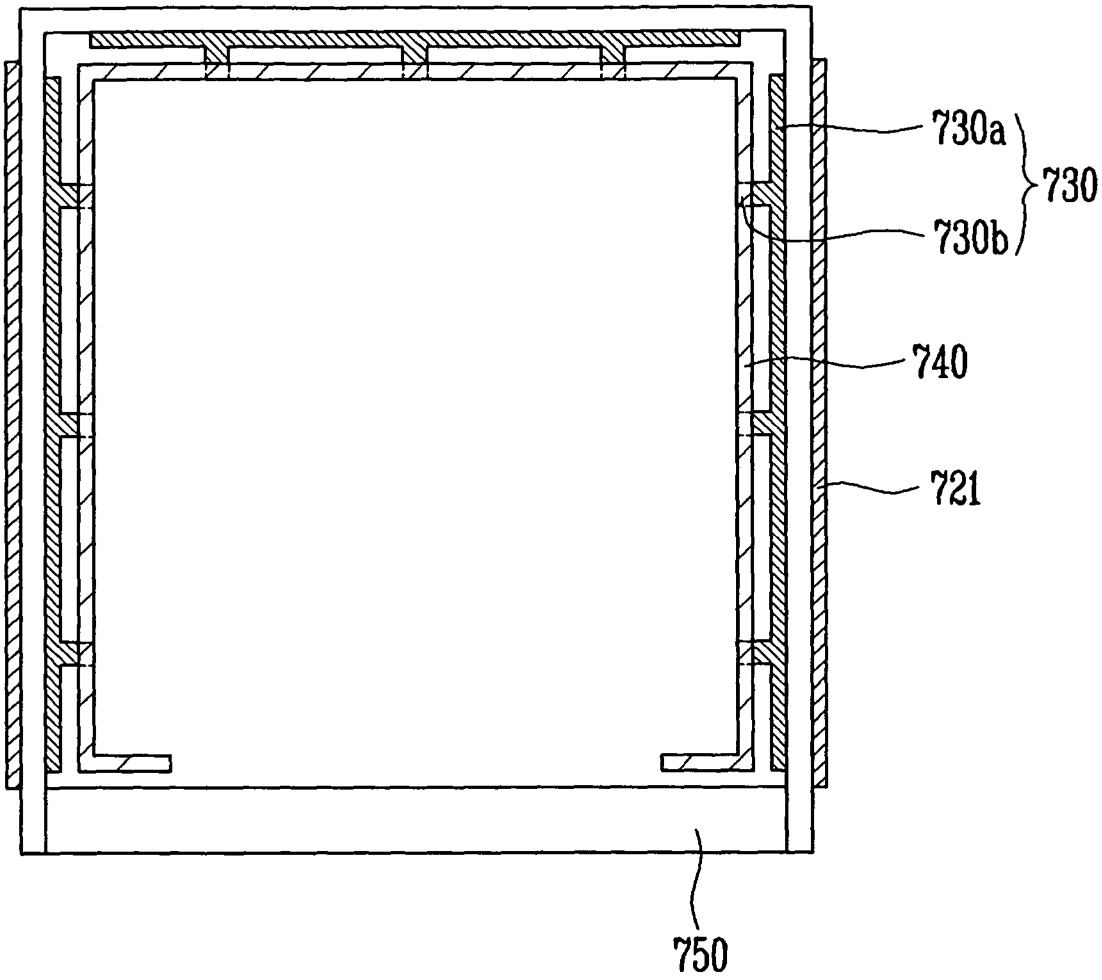
FIG. 7 is a plan view of a substrate firing device according to a fifth embodiment of the present invention.

Turning now to FIGS. 6 and 7, FIG. 6 is a plan view of a substrate firing device according to a fourth embodiment of the present invention, and FIG. 7 is a plan view of a substrate firing device according to a fifth embodiment of the present invention. In the descriptions of FIGS. 6 and 7, description of like elements as that of the first embodiment of the present invention will be omitted.

Referring to FIG. 6, in the substrate firing device according to the fourth embodiment of the present invention, first support portions 630 are arranged on inner surfaces of a firing furnace except at one region of a surface through which a substrate S is loaded and unloaded. Like the second and third embodiments of the present invention, each of the first support portions 630 includes a support frame 630*a* and support pins 630*b*, and a second support portion 640 is arranged on the support pins 630*b* of the first support portion 630. The second support portions 640 has a flat plate shape to support the substrate S while being in contact with an edge of a bottom surface of the substrate S at predetermined regions.

As shown in FIG. 7, a second support portion 740 is arranged on support pins 730*b* of a first support portion 730 according to the fifth embodiment of the present invention. In FIG. 7, the second support portion 740 has a rod shape and supports a substrates while being in line contact with an edge of a bottom surface of a substrate.

Comparing the fourth and fifth embodiments with second and third embodiments, a portion of the second support portion is arranged on a portion of an inner surface of a firing furnace into or from which a substrate is loaded and unloaded, so that it is possible to prevent the substrate from drooping, and the substrate can be fixedly supported. As such, a contact area between the substrate and the second support is increased, so that it is possible to prevent the second support portion from generating scratches on the substrate when the substrate expands and contracts due to temperature changes within the firing device.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A substrate firing device, comprising:
- a furnace;
- a heating portion to heat a plurality of substrates to a firing temperature by supplying heat into the furnace;
- a plurality of first support portions that include quartz material and are spaced-apart vertically by a distance from one-another, each of the plurality of first support portions disposed to support different ones of the substrates by including support frames horizontally arranged on opposing inner surfaces of the furnace, and a plurality of spaced-apart support pins protruding from the support frames toward a central portion of the furnace; and
- each of a plurality of second support portions borne by corresponding ones of the support pins, fabricated from quartz material and disposed to support an edge region of a bottom surface of the substrate that extends between a plurality of the support pins of one of the plurality of first support portions.

2. The substrate firing device of claim 1, each of the support frames being arranged on only one of the inner surfaces of the furnace and extend in parallel to a direction the substrate is loaded and unloaded.

3. The substrate firing device of claim 2, the second support portion having a flat plate shape.

4. The substrate firing device of claim 1, the support frames being arranged on all except one vertical inner surface, and the substrate is loaded and unloaded through a region of the excluded vertical inner surface.

5. The substrate firing device of claim 4, the second support portion having a shape selected from a group consisting of a flat plate shape and a rod shape.

6. The substrate firing device of claim 1, the heating portion being arranged on an outer surface of the furnace.

7. The substrate firing device of claim 1, the heating portion comprising an electric heater and a heat sink, the electric heater being arranged on the heat sink which spreads heat produced by the electric heater.

8. The substrate firing device of claim 1, further comprising a gate portion accommodating loading and unloading of the substrate through a surface of the furnace.

9. The substrate firing device of claim 8, the gate portion comprising:

an entire position control portion; and at least one segmented position control portion.

10. A substrate firing device, comprising:

a furnace;

a heating portion arranged on an outside surface of the furnace;

a plurality of first support portions that include quartz material arranged on at least two inner surfaces of the furnace, the first support portions being spaced-apart vertically, each of the plurality of first support portions including support frames horizontally arranged on opposing inner surfaces of the furnace and at least one support pin protruding from the first support portion and toward a central portion of the furnace; and each of a plurality of second support portions borne by corresponding ones of the support pins, the second support portions being fabricated from quartz material and disposed to provide support for a substrate along one edge region extending between opposite edges of a bottom surface of the substrate.

11. The substrate firing device of claim 10, the second support portion having a continuous shape formed of three portions and each of the three portions is formed by extending a length along each of all except one vertical inner surface of the furnace.

12. The substrate firing device of claim 10, the second support portion being arranged on all except one vertical inner surface and a portion of the vertical inner surface which is a front inner surface of the furnace.

13. The substrate firing device of claim 1, the furnace having all inner surfaces except a vertical inner surface, and the substrate being loaded and unloaded from the excluded vertical inner surface.

14. The substrate firing device of claim 13, each of the support frames of the first support portions being arranged along and attached to only one of the inner surfaces connecting with the excluded vertical inner surface.

15. The substrate firing device of claim 1, a central portion of the furnace being comprised of empty space.

16. The substrate firing device of claim 1, when a plurality of substrates being loaded into the firing device, only empty space is arranged between central portions of neighboring ones of the substrates.

17. The substrate firing device of claim 13, the second support portion being arranged adjacent and parallel to all except one vertical inner surface and a portion of the excluded vertical inner surface of the furnace.

18. The substrate firing device of claim 17, the first support portions being attached to all except one vertical inner surface of the firing device.

19. The substrate firing device of claim 1, the second support portion deterring scratching of a substrate arranged thereon upon large fluctuations in temperature.

20. The substrate firing device of claim 1, the first support portions and the second support portion are made of quartz.

21. A substrate firing device, comprising:

a furnace;

a heating portion to heat a plurality of substrates to a firing temperature by supplying heat into the furnace;

a plurality of first support portions that include quartz material and are spaced-apart vertically by a distance from one-another, each of the plurality of first support portions disposed to support different ones of the substrates by including support frames horizontally arranged on opposing inner surfaces of the furnace, and a plurality of spaced-apart support pins protruding from the support frames toward a central portion of the furnace; and each of a plurality of second support portions borne by corresponding ones of the support pins, fabricated from quartz material and disposed to move independently of corresponding ones of the first support portions and to support an entire length of an edge region of a bottom surface of the substrate.

* * * * *